US008258876B1

(12) United States Patent
Osika et al.

(10) Patent No.: US 8,258,876 B1
(45) Date of Patent: Sep. 4, 2012

(54) POWER AMPLIFIER PROTECTION CIRCUIT

(75) Inventors: David Osika, Neshanic Station, NJ (US); Joel Lott, Quakertown, PA (US); Julio Reyes, Leonia, NJ (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 12/986,915

(22) Filed: Jan. 7, 2011

(51) Int. Cl.
*H02H 7/20* (2006.01)
(52) U.S. Cl. ......................................... 330/298; 330/279
(58) Field of Classification Search ................... 330/298, 330/279, 302, 207 P
See application file for complete search history.

(56) References Cited

U.S. PATENT DOCUMENTS

| | | | | |
|---|---|---|---|---|
| 4,560,949 A | * | 12/1985 | Young | 330/284 |
| 4,563,775 A | * | 1/1986 | Yokosuka | 455/126 |
| 5,179,353 A | * | 1/1993 | Miyake | 330/129 |
| 6,720,831 B2 | | 4/2004 | Dening et al. | |
| 6,859,099 B2 | * | 2/2005 | Akaiwa | 330/149 |
| 7,205,842 B2 | * | 4/2007 | Gustavsson et al. | 330/279 |
| 7,205,843 B2 | | 4/2007 | Nagata | |
| 7,439,807 B2 | * | 10/2008 | Yong | 330/289 |
| 7,477,107 B1 | | 1/2009 | Wei et al. | |
| 7,702,301 B2 | * | 4/2010 | Rabjohn et al. | 455/126 |
| 7,710,201 B2 | * | 5/2010 | Kirisawa | 330/284 |

* cited by examiner

*Primary Examiner* — Henry Choe
(74) *Attorney, Agent, or Firm* — William L. Botjer

(57) ABSTRACT

A protection circuit for a power amplifier connected as a negative feedback loop around the power amplifier. The negative feedback loop comprises a detector circuit, a driver circuit and an attenuator circuit. The detector circuit receives output voltage from the power amplifier and generates a signal when the output voltage exceeds a predefined threshold. The driver circuit filters the signal received from the detector circuit to maintain feedback loop stability and adjusts the feedback loop bandwidth and gain to provide a filtered signal. The attenuator circuit receives the filtered signal and attenuates the input voltage of the power amplifier to reduce the output voltage of the power amplifier to a level below the predefined threshold.

15 Claims, 4 Drawing Sheets

POWER AMPLIFIER PROTECTION CIRCUIT

BACKGROUND OF THE INVENTION

The present invention generally relates to the field of power amplifiers used in wireless systems. More specifically, it relates to a protection circuit for wireless handset amplifier circuits.

A wireless system requires an air interface or antenna to transmit radio wave energy. Wireless systems such as mobile systems, which encompass systems based on Global System for Mobile Telecommunication (GSM)/EDGE standards, and the like, have to handle high power. The high power requirements of mobile systems illustrate the need for conversion of a low-power radio frequency signal to a high power signal. For this purpose, a Power Amplifier (PA) is used for driving the antenna in a mobile system. Ideally, a PA should be completely matched to the antenna so that maximum amount of energy is transmitted. The matching of an antenna and the corresponding PA is expressed in terms of a Voltage Standing Wave Ratio (VSWR), which is the ratio of maximum to minimum voltages in a standing wave. However, the impedance of antenna can vary due to environmental factors or antenna damage. This causes a mismatch between the antenna and the PA, as a result standing waves are formed by forward and reflected waves to and from the antenna giving rise to constructive or destructive interference. Ideally, a VSWR value of 1:1 indicates complete match between PA and antenna for maximum power transmission from antenna. High values of VSWR indicate a load mismatch, and load mismatch can cause damage to the power amplifier due to voltage breakdown. Additionally, other factors, such as power supply over voltage, temperature and excessive input drive demand the PA to be highly rugged. Thus, it is desirable to have a PA that is rugged and can withstand high VSWR load mismatch conditions. One possible solution to increase the ruggedness of power amplifiers is to design the PA to have a high output voltage breakdown capability. However, increase in the breakdown capability of the PA comes at the expense of performance factors such as Power Added Efficiency (PAE). Thus, a better solution is desired.

It is well known in the art to have a matching component or a matching network between a PA and antenna. One solution is to use an isolator, which transmits radio frequency power in one direction only. Thus, it can protect the PA from the effects of a mismatched load. However, an isolator adds some series loss, increases cost and grows the solutions footprint. A matching circuit cannot prevent voltage peaks at the output of a PA from causing damage to the PA due to voltage breakdown. Thus, it is desired to have a protection circuit, which can prevent damage to the PA due to voltage breakdown.

SUMMARY OF THE INVENTION

An object of the present invention is to provide a protection circuit for a power amplifier that prevents voltage peaks at the output of the power amplifier.

Another object of the present invention is to provide a self contained protection circuit for a power amplifier that is compact and rugged.

Another object of the present invention is to provide a detector at the output of a power amplifier that detects voltage peaks at the output of the power amplifier and provides a signal to trigger an adjustment at the input of the power amplifier.

Another object of the present invention is to provide an attenuator in a feedback circuit of a power amplifier. The attenuator reduces an input to the power amplifier in response to detection of voltage peaks at the output of the power amplifier.

Another object of the present invention is to provide a protection circuit for a power amplifier. The protection circuit comprises a negative feedback loop coupled to a power amplifier.

Another object of the present invention is to provide a stable feedback loop for a protection circuit of a power amplifier.

Another object of the present invention is to provide a circuit for protecting a power amplifier. The circuit includes a protection circuit, connected as a negative feedback loop around the power amplifier, a detector circuit, a driver circuit and an attenuator circuit. The detector circuit according to an embodiment of the present invention is configured to detect voltage peaks at an output of the power amplifier and provide a driver signal when the output exceeds a predefined threshold. The driver circuit is configured to filter the driver signal and provide a filtered signal. The driver circuit adjusts gain and phase margin of the negative feedback loop to maintain stability. The attenuator is configured to receive the filter signal from the driver circuit and adjust an input to the power amplifier, wherein adjustment in the input to the power amplifier causes the output voltage to fall below the predefined threshold and thus protects the power amplifier from damaging effects of the voltage peaks.

Another object of the present invention is to provide a method for protecting a power amplifier from damage due to breakdown. The breakdown is caused by high voltage peaks at an output of the power amplifier. The method comprises the steps of detecting the output of the power amplifier and providing a negative feedback signal at an input of the power amplifier. The step of providing the negative feedback signal further comprises providing a driver signal from a detector circuit when an output of the power amplifier exceeds a predefined threshold, filtering the driver signal to provide a filtered signal and attenuating the filtered signal to provide the negative feedback signal. The negative feedback is configured to reduce the output signal from the power amplifier to a level below the predefined threshold.

BRIEF DESCRIPTION OF THE DRAWINGS

Various embodiments of the invention will hereinafter be described in conjunction with the appended drawings, provided. To illustrate and not to limit the invention, wherein like designations denote like elements, and in which.

DESCRIPTION OF VARIOUS EMBODIMENTS

Figure 1:
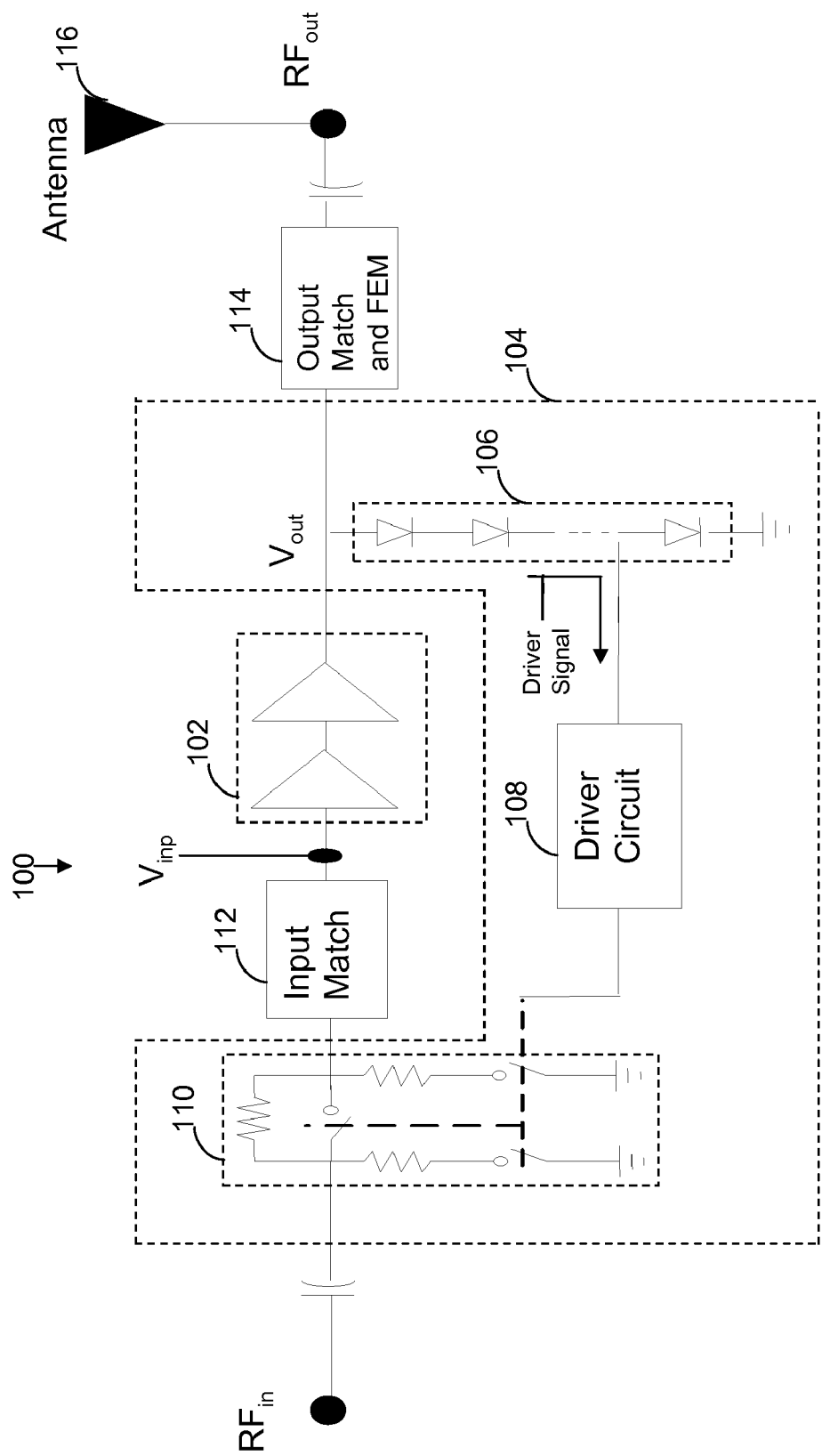
FIG. 1 is a simplified schematic representation of a block diagram of a circuit for protecting a power amplifier, in accordance with an embodiment of the invention.

Various embodiments of the invention provide a protection circuit for a Power Amplifier (PA) for preventing damage to the PA due to voltage breakdown. The protection circuit comprises a negative feedback loop coupled to the PA for providing an attenuated input voltage to the power amplifier, when an output voltage of the power amplifier exceeds a predefined threshold. The negative feedback loop comprises a detector circuit, a driver circuit and an attenuator circuit, which reduces the level of an input signal to the power amplifier FIG. 1 is a simplified schematic of a circuit 100 for a PA 102, in accordance with an embodiment of the invention. Circuit 100 includes a negative feedback loop 104. Negative feedback loop 104 further includes a detector circuit 106, a driver circuit 108 and an attenuator circuit 110. PA 102 amplifies a low level radio frequency signal ($RF_{in}$) at the input of an input matching circuit 112. Ideally, a PA should be completely matched to the antenna so that maximum amount of energy is transmitted. The matching of an antenna and the corresponding PA is expressed in terms of a Voltage Standing Wave Ratio (VSWR), which is the ratio of maximum to minimum voltages in a standing wave formed by forward and reflected waves to and from the antenna. PA 102 provides a high frequency radio signal ($RF_{out}$) at the output of an output matching circuit and Front End Module (FEM) 114, for transmission from an antenna 116. The matched input voltage signal ($V_{inp}$) is supplied at input port of PA 102. The amplified output voltage signal ($V_{out}$) is supplied to detector circuit 106. In an embodiment of the invention, detector circuit 106 comprises an array of diodes.

In other embodiments of the invention, detector circuit 106 is formed by one or more stacks of diodes. Detector circuit 106 operates when $V_{out}$ exceeds a predefined threshold. Detector circuit 106 is coupled to driver circuit 108, which provides averaging and signal level adjustments for maintaining stability of negative feedback loop 104. Driver circuit 108 comprises a filter circuit (not shown in FIG. 1) that provides a filtered signal. The filter circuit is in turn coupled to attenuator circuit 110, which completes the negative feedback loop 104. Attenuator circuit 110 is configured to decrease the $V_{inp}$ supplied to the input port of PA 102. The decrease in the input voltage causes $V_{out}$ to decrease. Output matching circuit and FEM 114 provides impedance matching or transformation between power amplifier 102 and antenna 116. Output matching circuit and FEM 114 further provide low pass harmonic filtering and transmit/receive switching. In an embodiment of the invention, detector circuit 106 does not operate when $V_{out}$ is completely matched to antenna 116 and $V_{out}$ is below the predefined threshold.

Figure 2:
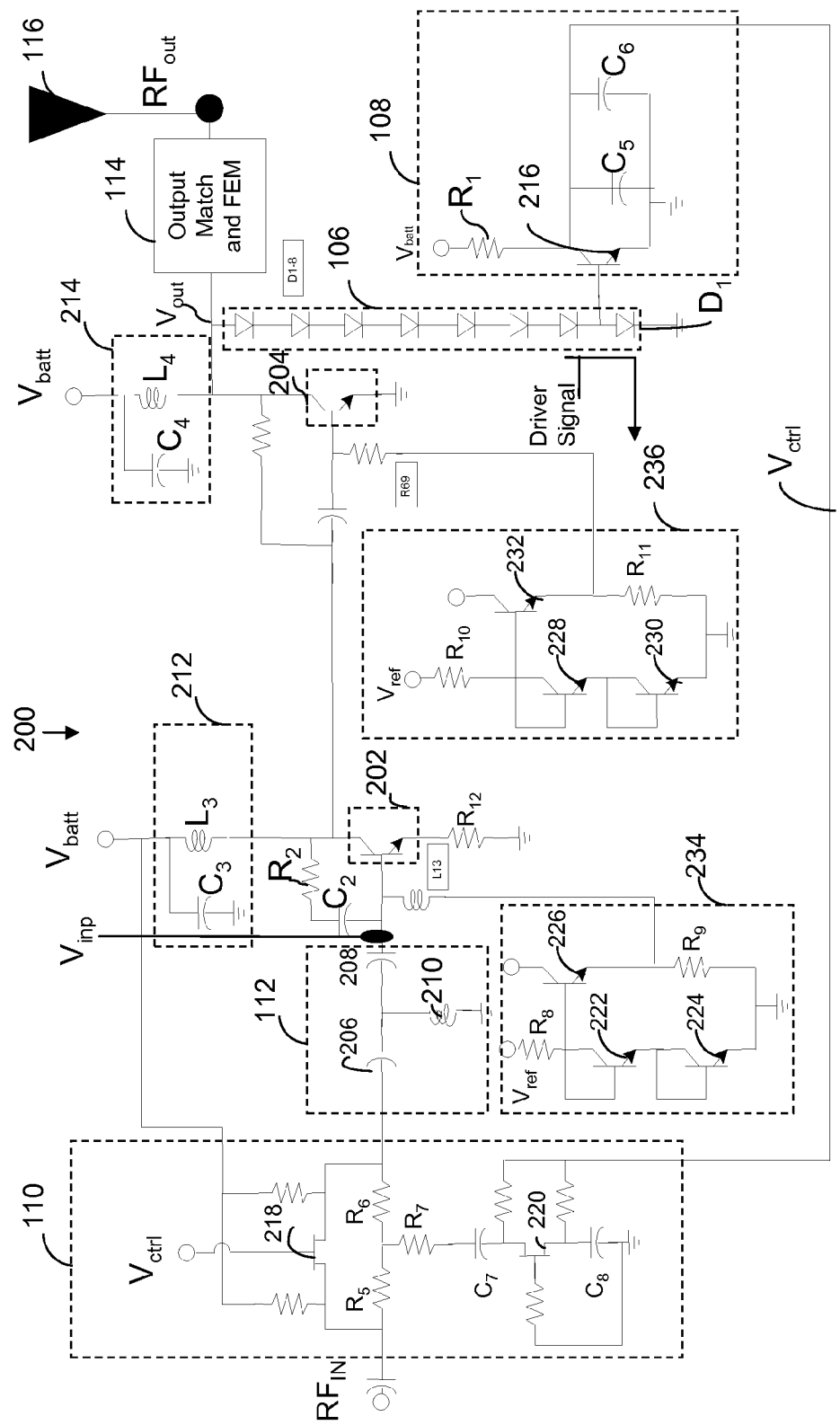
FIG. 2 is a schematic representation of a circuit diagram of a protection circuit module, in accordance with an embodiment of the invention.

FIG. 2 is a simplified schematic of a two stage amplifier 200 according to an embodiment of the present invention. In an embodiment of the invention, two stage amplifier 200 is used in a GSM wireless handset. In another embodiment of the invention, two stage amplifier 200 is an RF power amplifier. The two stages of amplifier 200 are formed by an input stage transistor 202 and an output stage transistor 204. Amplifier 200 has a gain of approximately 30 dB and an output power of +36 dBm, when the amplifier is driven into compression. Input stage transistor 202 is coupled to $RF_{in}$ via input matching circuit 112. Input matching circuit 112 includes a high pass filter circuit formed by capacitors 206 and 208 and an inductor 210. Inductor 210 is shunted to the ground. Input stage transistor 202 is also coupled to an R-C feedback circuit between a collector terminal and a base terminal. The R-C feedback circuit includes a resistor $R_2$ and a capacitor $C_2$. The R-C feedback circuit is configured to match the input impedance of the base terminal of input stage transistor 202. The impedance of antenna 116 is close to 50 Ohms. The collector terminal of input stage transistor 202 is further coupled to a bias circuit 212. Bias circuit 212 comprises an inductor $L_3$ and a bypass capacitor $C_3$. The inductor $L_3$ is also configured to perform impedance transformation between input stage transistor 202 and output stage transistor 204. Further, input stage transistor 202 is coupled to an emitter degeneration resistor $R_{12}$. The emitter degeneration resistor $R_{12}$ is configured to prevent thermal run-away and to add negative feedback to set the gain of the amplifier.

Similar to the configuration of input stage transistor 202, output stage transistor 204 is biased at a collector terminal by a bias circuit 214. Bias circuit 214 includes an inductor $L_4$ and a capacitor $C_4$. The bias circuit is connected to a power supply ($V_{batt}$). Output stage transistor 204 is further coupled to output matching circuit and FEM 114 at the collector terminal. Output matching circuit and FEM 114 includes an impedance transformer configured to transform impedance of approximately 2 Ohms for GSM applications at the collector terminal of output stage transistor 204 to impedance of approximately 50 Ohms at the $RF_{out}$ port of output matching circuit 114. However, the inductor $L_4$ has much higher impedance as compared to 2 Ohms at the collector terminal of output stage transistor 204.

According to the present embodiment of the invention, detector circuit 106 includes four stacks of Heterojunction Bipolar Transistor (HBT) diodes connected between the collector terminal and the grounded emitter terminal of output stage transistor 204. Each of the four stacks of HBT diodes comprises eight diodes, wherein each diode is configured to conduct at a voltage of approximately 1.3V. The voltage at which the diode conducts depends on the semiconductor technology used for the fabrication of the diode. The total number of diodes in each stack and the total number of stacks determine a predefined threshold at which detector circuit 106 conducts. However, those skilled in the art will recognize that the number of diodes in each stack and the number of stacks can vary according to the specific requirements of an embodiment of the invention. The diode stack does not need to be constructed from a uniform diode configuration and the bottom diode may be an HBT device configured as an emitter-base diode to match the input threshold of the drive circuit.

Output stage transistor 204 is connected to a battery or other power source such as a DC to DC converter. When the voltage on the base terminal of output stage transistor 204 swings around the base terminal, output stage transistor 204 conducts current through the inductor $L_4$. However, output stage transistor 204 stops to conduct current, when current of the base terminal of output stage transistor 204 declines and energy is stored in the magnetic field of inductor $L_4$. The energy stored in the inductor $L_4$ causes the RF voltage at the collector terminal of output stage transistor 204 to rise above $V_{batt}$, causing a voltage peak at the output of output stage transistor 204. The voltage peak is approximately 3 times the $V_{batt}$ in a compressed class AB amplifier. When antenna 116 is matched to the impedance at the input of output matching circuit 114, the voltage peak is less than the predefined voltage at which the diodes in detector circuit 106 conduct.

The voltage peak changes when antenna 116 is mismatched to an impedance of 50 Ohms This variation in load is transformed by the matching and FEM circuitry and can produce higher than normal voltage swings at the collector terminal of output stage transistor 204. The diodes in detector circuit 106 start conducting when the voltage peak increases above the predefined threshold.

Last diode $D_1$ of the stack in detector circuit 106 is connected to a transistor 216 in driver circuit 108. Driver circuit 108 further comprises a loop filter formed by a resistor $R_1$ and capacitors $C_5$ and $C_6$. When the diode $D_1$ conducts, transistor 216 also conducts and an output voltage $V_{ctrl}$ from driver circuit 108 decreases. The loop filter formed by the resistor $R_1$ and the capacitors $C_5$ and $C_6$ is configured to filter the voltage peak from detector circuit 106, to provide stability and phase margin to negative feedback loop 104. The loop filter is configured to maintain the stability and the phase margin of negative feedback loop 104 over all operating conditions and process variations.

The $V_{ctrl}$ from driver circuit 108 is coupled to input of attenuator circuit 110. Attenuator circuit 110 comprises plurality of elements including resistors: $R_5$, $R_6$, $R_7$, capacitors: $C_7$, $C_8$ and pseudomorphic High electron mobility transistor (Phemt) devices 218 and 220. The elements of attenuator circuit 110 form a tee attenuator. When detector circuit 106 is OFF, $V_{ctrl}=V_{batt}$. At this stage, transistor 220 is turned OFF, and transistor 218 is turned ON and attenuator circuit 110 is set for minimum attenuation.

When detector circuit 106 is ON, $V_{ctrl}$ falls towards 0V. At this stage, transistor 220 is turned ON, and transistor 218 is turned OFF and attenuator circuit 110 is set for maximum attenuation. The setting of attenuator circuit 110 to maximum attenuation causes $V_{inp}$ to decrease. Then $V_{inp}$ causes the output voltage $V_{out}$ to decrease, wherein the decrease in the value of $V_{out}$ causes the output voltage peaks to decrease to a value below the predefined threshold. The maximum attenuation of attenuator circuit 110 is set to a sufficiently high level, such that the Safe Operating Area (SOA) of PA 102 is not exceeded over any part of the RF cycle. SOA specifies the voltage and current conditions over which PA 102 can work without any damage.

FIG. 2 further includes a bias circuit 234 for input stage transistor 202, which is a temperature compensated current mirror. Bias circuit 234 comprises an emitter follower 226 and temperature compensating diodes 222 and 224, which are HBTs configured as base emitter diodes. Reference voltage ($V_{ref}$) supplies the bias current for bias circuit 234. The combination of emitter follower 226, temperature compensating diodes 222, 224 and a reference resistor $R_8$ makes a temperature compensated current mirror to keep the bias of input stage transistor 202 steady over temperature.

Similar to bias circuit 234, a bias circuit 236 for output stage transistor 204 is a temperature compensated current mirror. Bias Circuit 236 comprises an emitter follower 232 and temperature compensating diodes 228 and 230, which are HBTs configured as base emitter diodes. $V_{ref}$ supplies the bias current for bias circuit 236. The combination of emitter follower 232, temperature compensating diodes 228, 230 and a reference resistor $R_{10}$ makes a temperature compensated current mirror to keep the bias of output stage transistor 204 steady over temperature.

In an embodiment of the invention, a method of protecting PA 102 from damage due to voltage breakdown is provided. Output voltage of PA 102 is detected by detector circuit 106. If the output voltage exceeds the predefined threshold, a negative feedback signal is provided at the input of PA 102 via the negative feedback loop 104. The negative feedback signal reduces the output voltage below the predefined threshold. The negative feedback signal is driven by detector circuit 106 by sending a driver signal to driver circuit 108. Driver circuit 108 adjusts gain and phase margin of negative feedback loop 104 to maintain stability. Driver circuit 108 further comprises the filter circuit that provides a filtered signal to attenuator circuit 110. Attenuation of the filtered signal is performed by a tee attenuator.

Figure 3:
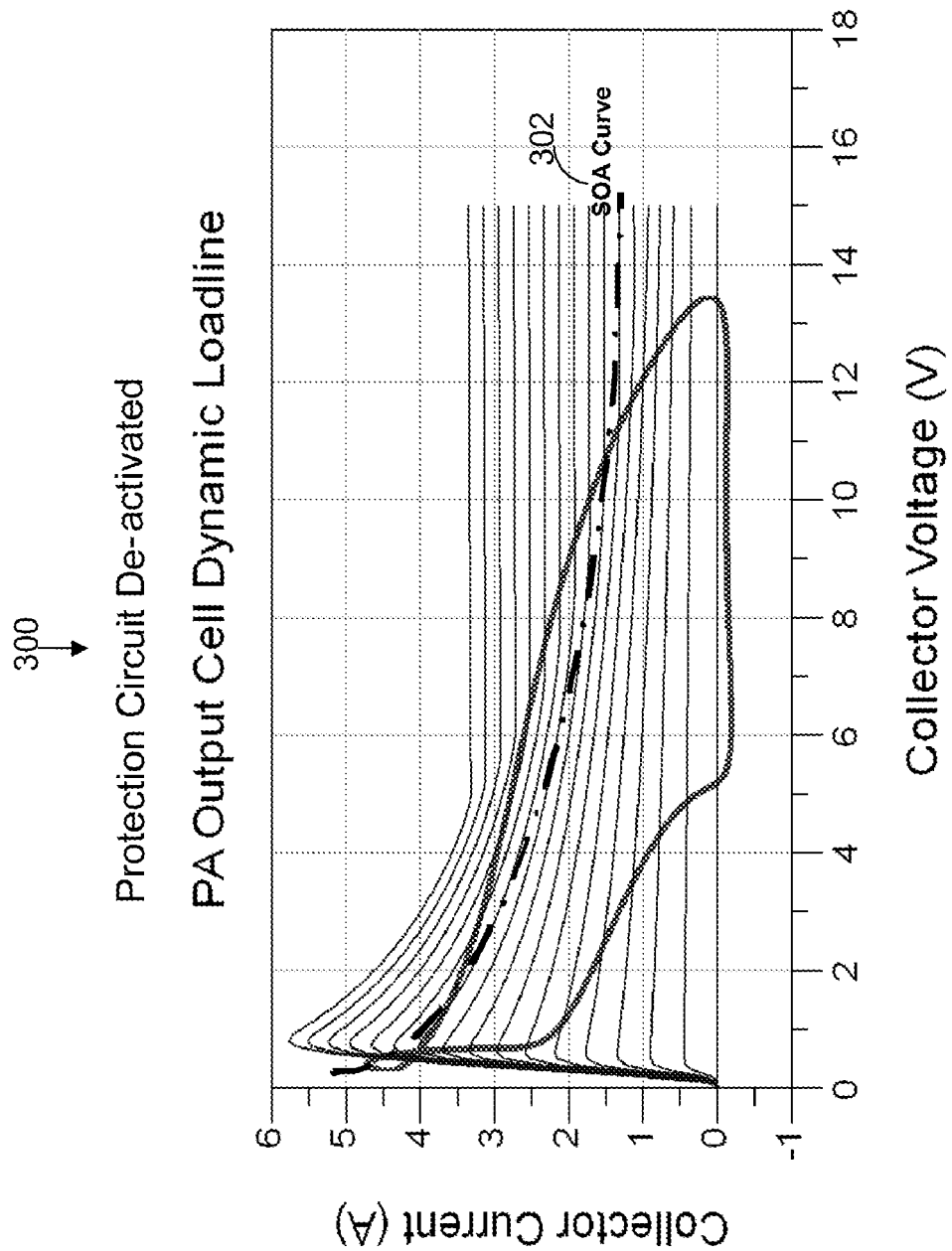
FIG. 3 is a graphical representation of a dynamic load line of a conventional power amplifier module without a protection circuit.

FIG. 3 is a graphical representation of a dynamic load line of a conventional power amplifier without a protection circuit. The dynamic load line is a plot of output device voltage on the abscissa and output collector current on the ordinate. SOA curve 302 identifies the maximum values of the output collector current at which the device can operate without damage at different values of the output device voltage. In the absence of protection circuit, the collector current exceeds the limit specified by the SOA curve 302. This can cause damage to PA 102.

Figure 4:
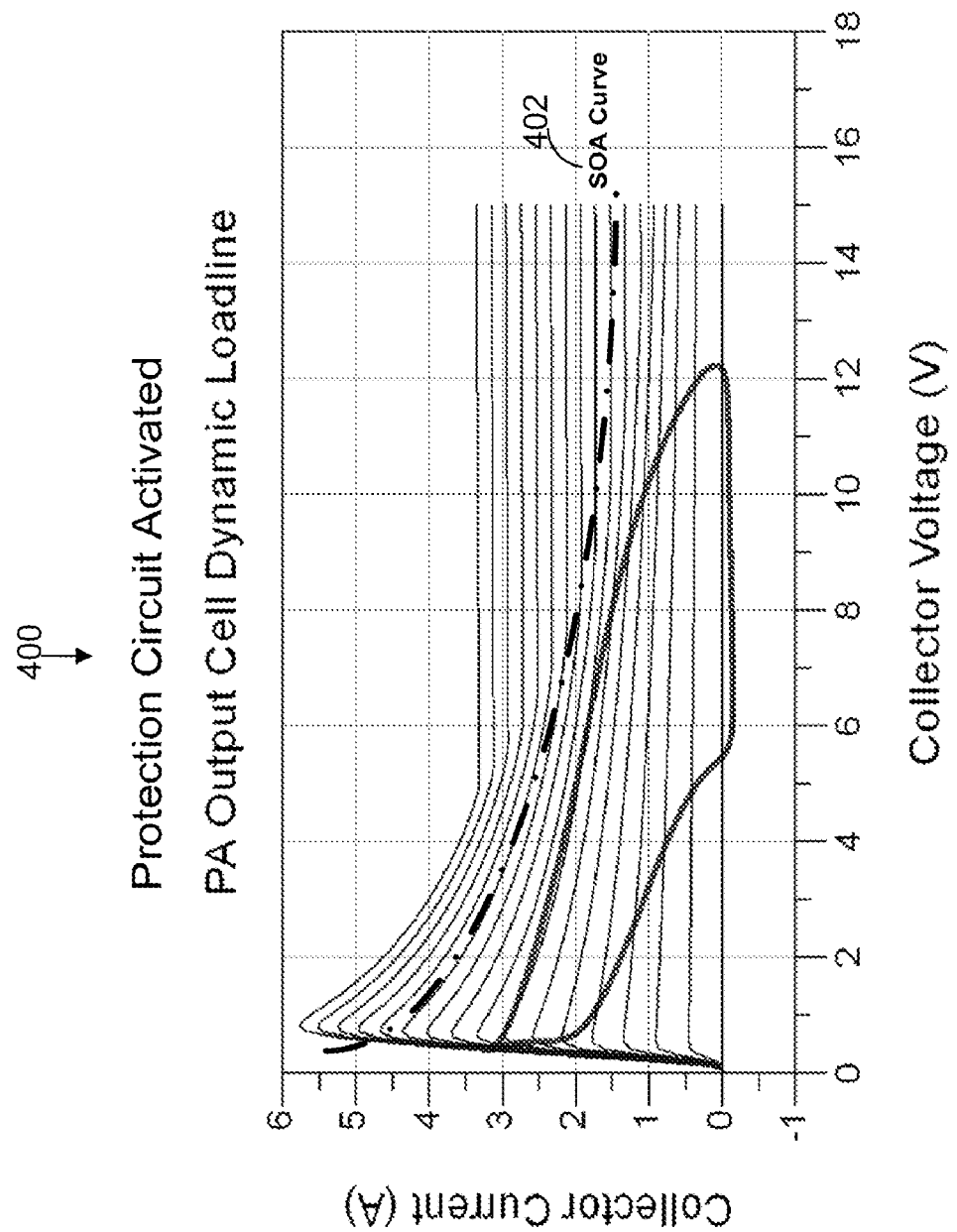
FIG. 4 is a graphical representation of a dynamic load line of a power amplifier module with a protection circuit module, in accordance with an embodiment of the invention.

FIG. 4 is a graphical representation of a dynamic load line of a conventional power amplifier module with a protection circuit of the present invention. The dynamic load line is a plot of output device voltage on the abscissa and output collector current on the ordinate. SOA curve 402 identifies the maximum values of the output collector current at which the device can operate without damage at different values of the output device voltage. In the presence of protection circuit, the collector current does not exceed the limit specified by SOA curve 402. Thus, a device, such as PA 102 is prevented from damage.

The protection circuit of the present invention uses protection diodes at the output of the power amplifier to limit collector voltage peaks. As a result, the protection circuit does not require a number of additional components and is thus cost efficient. Moreover, the device in the detector part of the circuit can be just one small cell and have the optimized emitter area that is capable of meeting layout design rules making the circuit area optimized. Also, the capacitors $C_5$ and $C_6$ are small area Metal-Insulator-Metal (MIM) capacitors. Further, the attenuator uses small area size resistors, small size pHEMTS and DC blocking caps since they are used to attenuate the relative small signal level at the input of the PA. The cost of adding this circuit to the other power amplifier circuitry is relatively low. Further, the circuit also allows a smaller output stage design to be used in the PA, since it enhances the ruggedness of a comparatively smaller size output stage device. The output stage device takes up a substantial portion of the total die area, hence this saving could be greater than the die area used for the protection circuit, resulting in an overall cost savings.

While various embodiments of the present invention have been illustrated and described, it will be clear that the invention is not limited to these embodiments only. Numerous modifications, changes, variations, substitutions and equivalents will be apparent to those skilled in the art, without departing from the basic scope and spirit of the invention, as described in the claims that follow.

What is claimed is:

1. A circuit for power amplification, the circuit comprising:
   a. a power amplifier, the power amplifier having an input port and an output port, the power amplifier having at least one transistor, and a current mirror is coupled between a base terminal of the at least one transistor and a ground node; and
   b. a protection circuit connected as a negative feedback loop around the power amplifier, the protection circuit including:
      i. a detector circuit configured to detect an output voltage from the output port, wherein the detector circuit provides a driver signal when the output voltage exceeds a predefined threshold;
      ii. a driver circuit configured to receive the driver signal from the detector circuit, wherein the driver circuit is configured to adjust a gain and phase margin of the negative feedback loop to maintain stability, and wherein the driver circuit includes a filter circuit that provides a filtered signal; and
      iii. an attenuator circuit coupled with the input port and the driver circuit, wherein the attenuator circuit is configured to receive the filtered signal from the filter circuit and attenuate an input voltage at the input port, wherein attenuation in the input voltage results in reduction of the output voltage below the predefined threshold.

2. The circuit of claim 1 further comprising a resistor coupled to the current mirror, wherein the resistor and the current mirror are configured to provide temperature compensation for the power amplifier.

3. The circuit of claim 1, wherein the input port is coupled to an input matching circuit, wherein the input matching circuit comprises a high pass filter circuit.

4. The circuit of claim 1, wherein the output port is coupled to an output matching circuit, wherein the output matching circuit provides impedance transformation.

5. The circuit of claim 1, wherein the detector circuit comprises one or more stacks of diodes, and wherein the number of diodes in each of the one or more stacks and the number of stacks determine the predefined threshold.

6. The circuit of claim 1, wherein the driver circuit further comprises an amplifier coupled to the filter circuit and the detector circuit, the amplifier being configured to conduct current based on the driver signal received from the detector circuit.

7. The circuit of claim 1, wherein the attenuator circuit is a tee attenuator circuit.

8. A method of protecting a power amplifier from damage due to voltage breakdown, the method comprising the steps of:
   a. detecting an output voltage at an output port of the power amplifier; and
   b. providing a negative feedback signal at an input port of the power amplifier for reducing the output voltage of the power amplifier below a predefined threshold, the step of providing the negative feedback signal comprising:
      i. providing a driver signal when the output voltage exceeds the predefined threshold, the driver signal being provided by a detector circuit, the detector circuit having one or more stacks of diodes, the number of diodes in each of the one or more stacks and the number of stacks determining the predefined threshold;
      ii. providing a filtered signal based on the driver signal; and
      iii. attenuating an input voltage at the input port based on the filtered signal.

9. The method of claim 8, wherein the filtered signal is provided by a filter circuit, the filter circuit being coupled to a transistor, and wherein the transistor conducts when the driver signal is received from the detector circuit.

10. The method of claim 8, wherein the attenuation is performed by a tee attenuator.

11. A protection circuit for a power amplifier, the power amplifier having an input port and an output port, the protection circuit comprising:
   a. a detector circuit configured to detect an output voltage from the output port, the detector circuit providing a driver signal when the output voltage exceeds a predefined threshold;
   b. a driver circuit configured to receive the driver signal from the detector circuit, the driver circuit including a filter circuit that provides a filtered signal; and
   c. an attenuator circuit coupled with the input port and the driver circuit, the attenuator circuit being configured to receive the filtered signal from the filter circuit and attenuate an input voltage to the input port, and wherein a reduction in the input voltage results in a reduction of the output voltage below the predefined threshold, and wherein the power amplifier comprises at least one transistor and a current mirror is coupled between a base terminal of the at least one transistor and a ground node.

12. The protection circuit of claim 11 further comprising a resistor coupled to the current mirror, the resistor and the current mirror being configured to provide temperature compensation for the power amplifier.

13. The protection circuit of claim 11, wherein the detector circuit comprises one or more stacks of diodes, wherein the number of diodes in each of the one or more stacks and the number of stacks determine the predefined threshold.

14. The protection circuit of claim 11, wherein the driver circuit further comprises an amplifier coupled to the filter circuit and the detector circuit, the amplifier being configured to conduct current based on the driver signal received from the detector circuit.

15. The protection circuit of claim 11, wherein the attenuator circuit is a tee attenuator circuit.

* * * * *